United States Patent [19]

Politiek et al.

[11] Patent Number: 5,151,605
[45] Date of Patent: Sep. 29, 1992

[54] METHOD OF IRRADIATING AN OBJECT BY MEANS OF A CHARGED PARTICLE BEAM, AND DEVICE FOR PERFORMING THE METHOD

[75] Inventors: Jarig Politiek; Henricus J. Ligthart, both of Eindhoven, Netherlands

[73] Assignee: U.S. Philips Corporation, New York, N.Y.

[21] Appl. No.: 679,976

[22] Filed: Apr. 3, 1991

[30] Foreign Application Priority Data

Apr. 9, 1990 [NL] Netherlands ............... 9000822

[51] Int. Cl.⁵ ........................................... H01J 37/317
[52] U.S. Cl. ........................... 250/492.2; 250/398
[58] Field of Search ........... 250/492.21, 492.2, 492.3, 250/398

[56] References Cited
U.S. PATENT DOCUMENTS 4,766,320 8/1988 Naitoh et al. .................. 250/492.2
4,782,304 11/1988 Aitken ......................... 250/492.2
4,851,693 7/1989 Fisher ........................... 250/492.2

FOREIGN PATENT DOCUMENTS 0263032 4/1988 European Pat. Off. .
62-126539 6/1987 Japan ......................... 250/492.3
62-285354 12/1987 Japan ......................... 250/429.3

Primary Examiner—Jack I. Berman
Attorney, Agent, or Firm—Paul R. Miller

[57] ABSTRACT

A low-energetic charged particle beam, involving only a slight space charge effect, can be obtained by high-frequency deflection of a charged particle beam before deceleration. Using a deceleration element provided with curved surfaces and a slit-shaped aperture, a focusing effect is obtained so that the charged particle beam is imaged along a linear path on a target surface. For implantation of a semiconductor substrate, a uniform and shallow implantation can be achieved at adequate speed by means of a low-energetic ion beam obtained in the above manner.

18 Claims, 3 Drawing Sheets

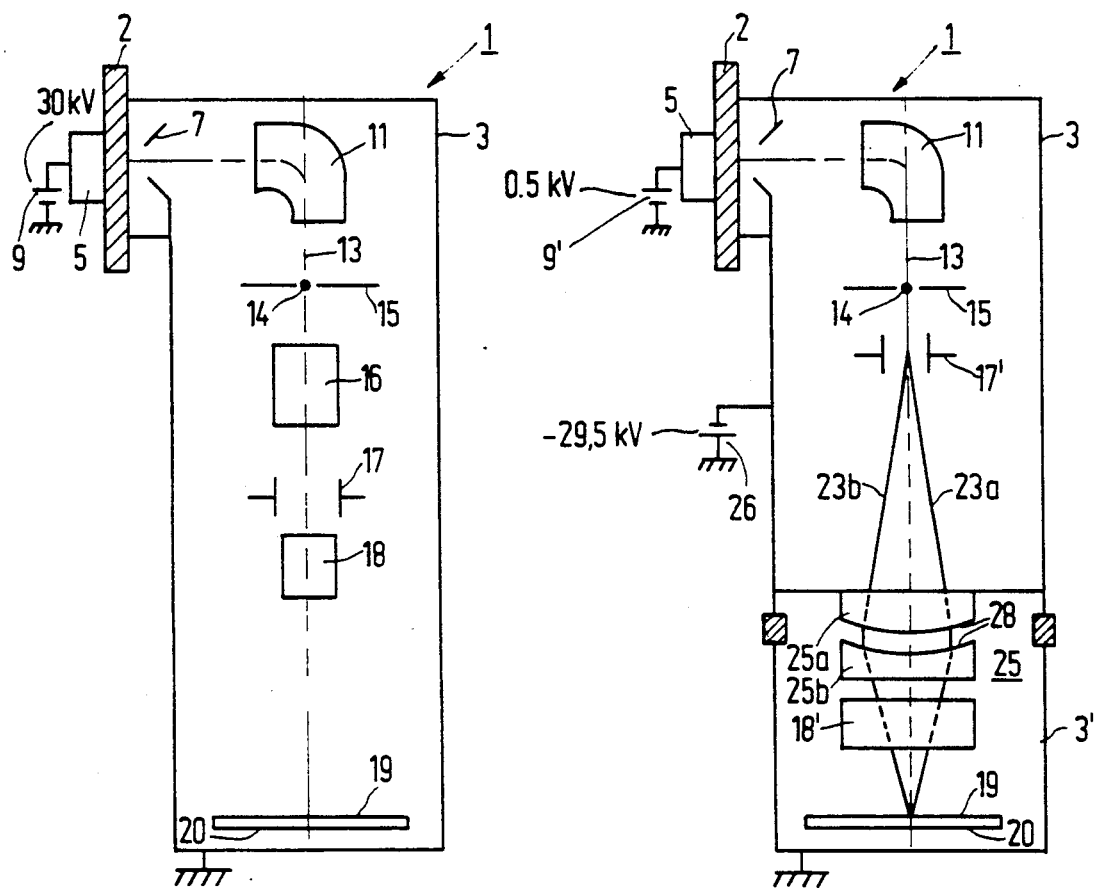
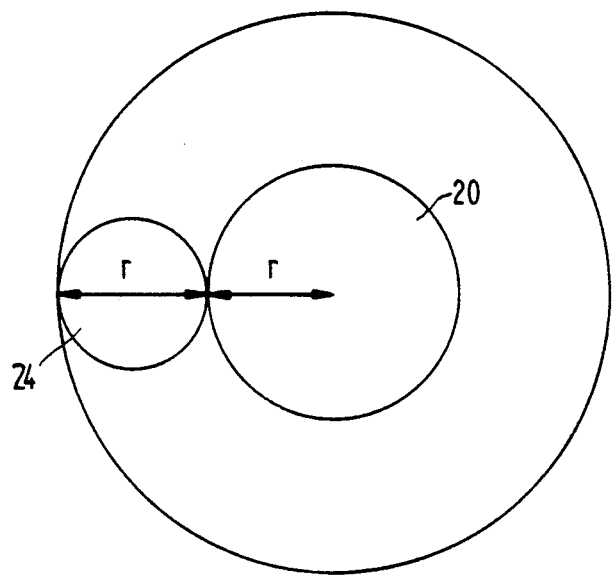
FIG.1a PRIOR ART
FIG.1b
FIG.2

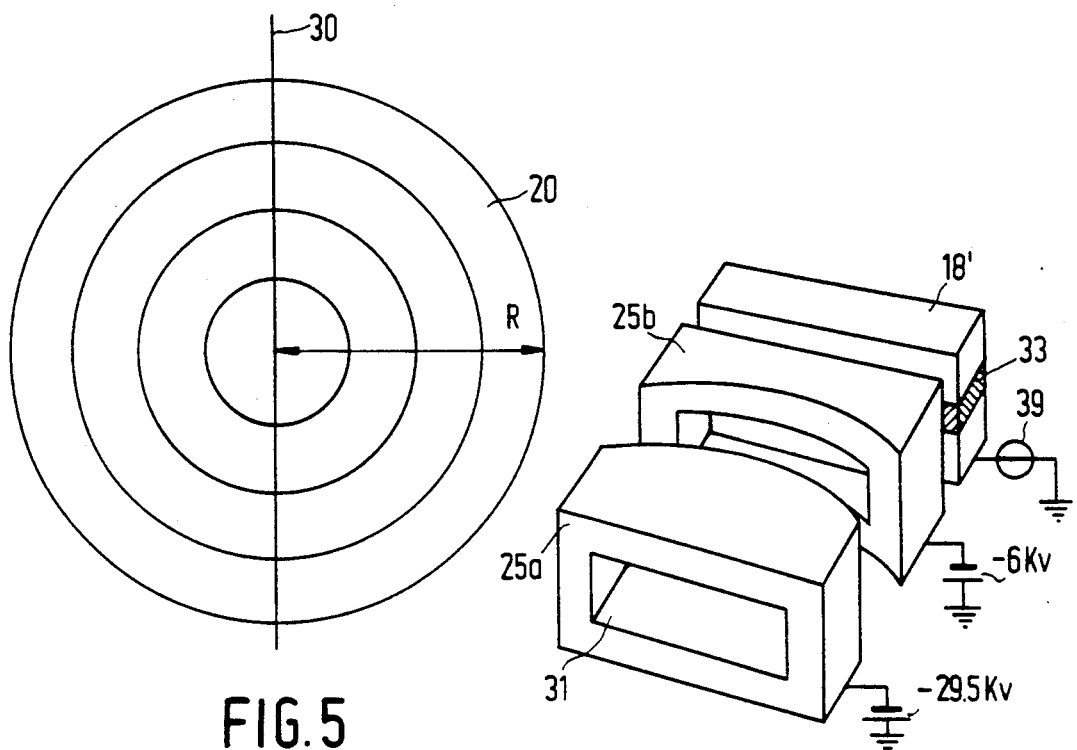
FIG.5
FIG.7a
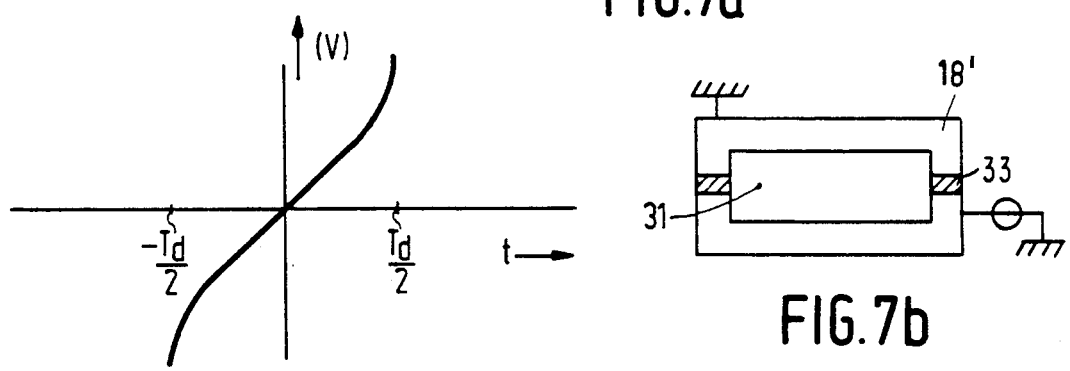
FIG.6
FIG.7b
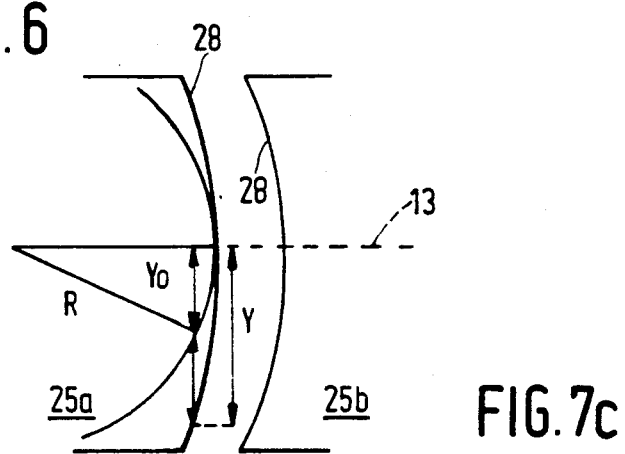
FIG.7c

METHOD OF IRRADIATING AN OBJECT BY MEANS OF A CHARGED PARTICLE BEAM, AND DEVICE FOR PERFORMING THE METHOD

The invention relates to a method of irradiating an object by means of a charged particle beam, where a charged particle beam emitted by a source in a charged particle beam system is deflected in two mutually perpendicular scanning directions, extending transversely of the optical axis, by means of a first and a second deflection element situated along an optical axis.

The invention also relates to a device for performing the method.

BACKGROUND OF THE INVENTION

A method and device of this kind are known from Yukinori Ochiai e.a., "Focused Ion Beam Technology", Solid State Technology/November 1987, pp 75-78.

The cited article describes a method where patterns are inscribed in a photoresist layer on a semiconductor substrate by means of a focused ion beam, or ions are implanted directly in the semiconductor substrate. To achieve this, an ion beam is generated in a charged particle beam system, for example by means of a liquid metal ion source, which beam is accelerated to some hundreds of keV by means of electrodes arranged along an optical axis. Using an electrostatic condensor lens, the ion beam is imaged in a focused manner in a mass-separation system in which mutually perpendicular electrostatic and magnetic fields transmit only ions of appropriate mass (ExB filter). An electrostatic stigmator corrects the ion beam for deviations in the cross-section which is circular in the ideal case. After having passed an objective lens which comprises a number of electrodes which are arranged so as to be spaced apart around the optical axis and which have a circular aperture, the ion beam is deflected across the semiconductor substrate by means of a deflection element. The diameter of the ion beam on the substrate then amounts to 0.1 $\mu$m, and a beam current may amount to from 1 $\mu$A to 100 $\mu$A. The ion energy amounts to from 10 to 150 keV at the area of the substrate.

For shallow implantation of ions, directly below the surface of the irradiated object, it is desirable to implant ions having a low energy (less than 1 keV). A problem encountered in the case of such low energies consists in that for current densities of approximately 100 $\mu$A the beam diameter increases substantially due to the effect of the radial Coulomb interaction between the ions; this interaction is large for the given current at a comparatively low speed of the ions (the space charge effect). A drawback of a large beam diameter consists in that for uniform implantation of a substrate the beam must be deflected as far as beyond the substrate. For a substrate having a diameter of, for example 10 cm, in the case of a beam diameter of 5 cm a surface which is approximately four times greater than the surface of the substrate must be scanned. As a result, the duration of implantation is unnecessarily long, thus impeding efficient production of large numbers of implanted substrates. Furthermore, in the case of prolonged implantation the risk of contamination of the substrate is comparatively high.

SUMMARY OF THE INVENTION

It is inter alia an object of the invention to provide a method where efficient and uniform ion implantation in a substrate takes place at a comparatively low energy (less than 1 keV). It is another object of the invention to provide a device which is suitable for performing this method.

To achieve this, a method of irradiating an object by means of a charged particle beam in accordance with the invention is characterized in that the charged particle beam is first periodically deflected in one of the scanning directions by means of the first deflection element, after which it is decelerated by means of a deceleration element.

By periodically deflecting the charged particle beam at a comparatively high frequency before the beam is decelerated, a virtually moving source of charged particles is formed which is imaged on the substrate by the focusing device. The space charge of the beam between the first deflection element and the substrate thus decreases sufficiently to prevent an increase of the beam diameter to undesirable dimensions.

A version of a method of irradiating an object by means of a charged particle beam in accordance with the invention is characterized in that the charged particle beam is deflected by the first deflection element with a frequency of between 1 and 10 MHz.

Due to the high deflection frequency, the spatial distribution of the ions exhibits a large number of oscillations with respect to the optical axis at a given instant t, so that a length over which the ions are distributed between the deflection element and the deceleration element at the instant t is increased and the space charge is reduced in proportion. The deflection frequency cannot be arbitrarily increased, because the angle through which the particles are deflected with respect to the optical axis decreases as the frequencies become higher.

A further version of a method of irradiating an object by means of a charged particle beam in accordance with the invention is characterized in that the first deflection element comprises an electrostatic deflection element to which a sinusoidal voltage is applied.

At deflection frequencies in the order of magnitude of some MHz, a sinusoidal deflection signal can be readily realised in comparison with a delta voltage.

A further version of a method of irradiating an object by means of a charged particle beam in accordance with the invention is characterized in that the object is rotated about an axis of rotation which has at least one point in common with the optical axis, the second deflection element receiving a periodic voltage which, for one half period, as a function of time, is substantially equal to an at least third-order polynomial containing exclusively odd exponents.

By rotation of the target surface, a uniform implantation can be obtained when an adapted delta voltage across the second deflection device is used. The axis of rotation may be situated adjacent the optical axis or may intersect the optical axis at an angle.

It is to be noted that a method of irradiating an object by means of a charged particle beam and utilizing a rotating target surface is known per se from European Patent Application EP 263032-A1. However, therein the target surface is rotated in order to facilitate a scanning motion thereacross. From the cited Patent Application it cannot be deduced that greater uniformity of implanted charged particles can be achieved by rotation of the target surface.

A preferred version of a method of irradiating an object by means of a charged particle beam in accordance with the invention is characterized in that a semiconductor substrate is used as the object and an ion beam is used as the charged particle beam.

The method can be used notably in the semiconductor industry where large numbers of semiconductor substrates are implanted. When a layer of semiconductor material is vapour deposited on the substrate (MBE) simultaneously with the implantation of low-energetic ions (for example, P, B or As), well-defined doping profiles can be obtained which contain only few contaminating oxygen atoms.

A charged particle beam system comprising a source for emitting a charged particle beam and a first and a second deflection element which are situated along an optical axis and which serve to deflect the charged particle beam across a target surface in two mutually perpendicular scanning directions, in accordance with the invention is characterized in that the charged particle beam system comprises a deceleration element which is situated along the optical axis, the first deflection element being situated between the source and the deceleration element.

As a result of the inclusion of a deceleration element and a deflection element which is situated between the source and the delay element in a charged particle beam system, the charged particle beam can be extracted from the source only at a comparatively high energy, thus ensuring a large current, after which the charged particle beam can be deflected so as to reduce the space charge, followed by deceleration to the required low energy.

A preferred embodiment of a charged particle beam system in accordance with the invention is characterized in that between the first deflection element and the deceleration element there is included a focusing element for focusing the charged particle beam in a first focusing direction, the deceleration element having a focusing effect in a second focusing direction which extends perpendicularly to the first focusing direction.

The focusing element images the ion beam on the target surface in a first focusing direction in a well-defined manner. A point-shaped beam is imaged as an ellipse on the target surface by the focusing device, for example a multi-pole magnetic lens. In cooperation with the deceleration element, the beam is imaged on the target in a well-defined manner (point-shaped) in two mutually perpendicular focusing directions. The deceleration element comprises, for example a number of conductors which are situated along the optical axis and which carry a different potential, each conductor being provided with a slit of adequate length for transmitting the beam during its high-frequency deflection.

A further preferred embodiment of a charged particle beam system in accordance with the invention is characterized in that the deceleration element comprises at least two conductors, each of which is provided with a curved surface and a slit.

Because the deceleration element of this kind has a focusing effect in two focusing directions, the focusing device can be dispensed with; this means a saving as regards space. An embodiment of the deceleration element, for example in the form of three curved plate-shaped electrodes, each of which is provided with a slit, already appears to have adequate focusing properties for imaging the beam on the target surface in a focused manner in two mutually perpendicular focusing directions.

A further preferred embodiment of a charged particle beam system in accordance with the invention is characterized in that the second deflection element is to be connected to a voltage source for the supply of a voltage which varies periodically in time and which exhibits a variation in time, over one half period, which approximates an at least third-order polynomial containing exclusively odd exponents.

The deceleration element decelerates the ion beam from, for example 30 keV to 0.5 keV. At the area of the last electrode of the deceleration element the charged particle beam has a comparatively low energy, so that at the area of the last electrode deflection can take place using low deflection voltages. When the last electrode of the deceleration element is constructed as two mutually insulated parts, an alternating voltage can be applied across these parts so that the charged particle beam is moved in a scanning direction which extends perpendicularly to the scanning direction in which the beam has been moved so as to reduce the space charge.

BRIEF DESCRIPTION OF THE DRAWINGS

Some versions of a method and a device in accordance with the invention will be described in detail hereinafter with reference to the accompanying drawing. Therein:

FIGS. 1a and 1b show a known device and a device in accordance with the invention, respectively, for irradiating an object by means of a charged particle beam, FIG. 2 shows a scanning surface during implantation of a substrate by means of a low-energetic charged particle beam, FIG. 5 shows an implantation distribution of the charged particles in a rotating substrate, FIG. 6 shows a deflection voltage across the second deflection element, and FIGS. 7a, 7b and 7c are a perspective view of a deceleration element in accordance with the invention, a front view of the second deflection element, and a plan view of the electrodes of the deceleration element, respectively.

DESCRIPTION OF THE INVENTION

Figure 3A:
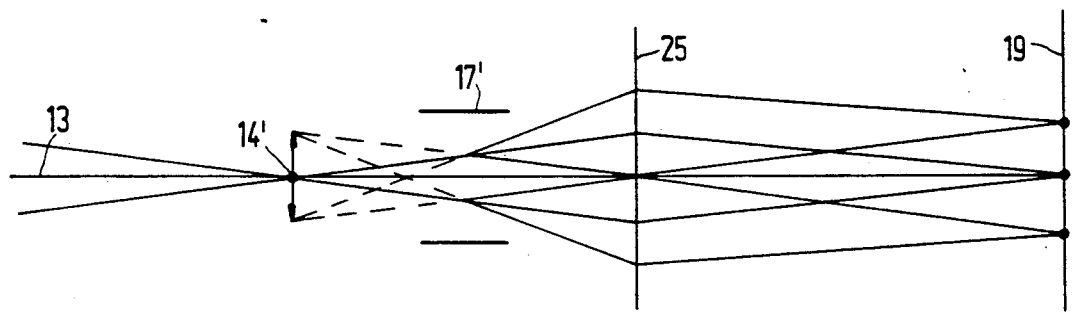
FIGS. 3a and 3b show a beam path upon deflection of the charged particle beam.

FIG. 1a shows a known charged particle beam system 1 which comprises a source 5, for example an ion source, which is connected to a vacuum envelope 3 via an insulator 2. The ion beam emitted by the source 5 is accelerated to an energy of, for example 30 keV by means of an electrode 7. A supply voltage source 9 which is connected to the source 5 carries a potential of 30 kV with respect to ground, the electrode 7 connected to the vacuum envelope 3 being grounded. Possibly in cooperation with further particle-optical elements not shown in the Figure, a magnet 11 images a cross-over 14 of the ion beam at the area of an aperture in a diaphragm 15. The magnet 11 deflects the ion beam along the optical axis 13, so that only ions having the correct ratio of charge and mass pass through the aperture. The ion beam is imaged on a target surface 19 of a substrate 20 by means of a focusing device 16. Using deflection elements 17 and 18, for example electrodes, the ion beam is deflected across the target surface 19 in two mutually perpendicular directions, so that uniform implantation of ions can take place in the substrate 20. Low-energetic ions have a small penetration depth in the substrate 20 which comprises, for example a semiconductor substrate, resulting in well-defined and shallow doping profiles in the case of simultaneous deposition of an epitaxial layer thereon. At 0.5 kV, the penetration depth of B, P, AS or Sb in Si amounts to a few nanometers. In order to implant the substrate 20 with low-energetic ions with a sufficiently large current (100 μA), a deceleration element can be arranged between the focusing element 16 and the substrate 20, which deceleration element carries a voltage of −0.5 kV with respect to the source 5. However, the beam diameter is then increased to undesirable dimensions. This has the drawback that, as appears from FIG. 2, the surface to be scanned by the ion beam is larger than the substrate for uniform implantation of the substrate 20 where the ion beam 24 is deflected beyond the edges of the substrate. When a substrate having a radius r is scanned by an ion beam having a diameter r, the ratio of the surface scanned by the beam to the substrate surface is 4/1. In the case of implantation with a small current (1 μA), the increase of the beam diameter due to the space charge is small, but the time required for implantation is too long. For a beam current of 1 μA and an ion concentration of $10^{19}$ cm$^3$ to be implanted in the substrate over a depth of 0.5 μm, the duration for uniform implantation of a substrate having a diameter of 10 cm amounts to approximately 7 hours.

FIG. 1b shows a charged particle beam system 1 in accordance with the invention which comprises a deceleration element 25. The ions emitted by the source 5 are deflected in the plane of drawing by the deflection element 17' at a high-frequency (1–10 MHz). The extreme beam positions are represented by the rays 23a and 23b. The source 5 carries a voltage of 30 kV with respect to the electrode 7 and is connected to a supply voltage source 9' carrying a voltage of 0.5 kV with respect to ground. The electrode 7 is connected, via the vacuum envelope 3, to a supply voltage source 26 carrying −29.5 kV with respect to ground. Within a section 3' which is insulated from the vacuum envelope 3 there is arranged the deceleration element 25 for decelerating the ion beam to ground potential. The deceleration element comprises, for example three electrodes, the electrode 25a carrying a voltage of −29.5 kV, while the electrode 25b carries a voltage of −6 kV and the third electrode (18') is connected to ground. The deceleration element 25 shown in the Figure sharply focuses the ion beam on the substrate 20 in a first focusing direction, extending in the plane of drawing, as well as in a focusing direction extending perpendicularly to the plane of drawing. For well-focused imaging in the plane of drawing, the electrodes 25a and 25b of the deceleration element have a curved surface 28. If a focusing device which sharply focuses the ion beam in the focusing direction in the plane of drawing is inserted between the deflection element 17' and the deceleration element 25, the curvature of the electrodes 25a and 25b can be dispensed with.

Figure 3B:
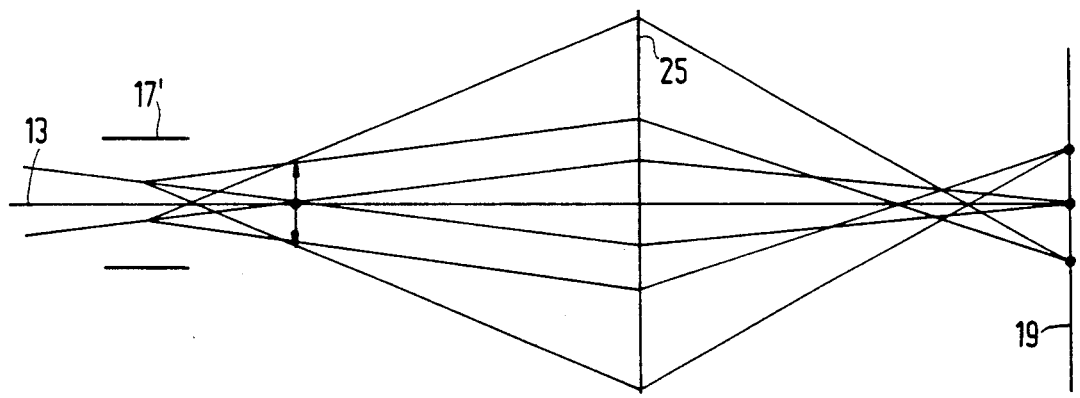

FIG. 3a shows that a virtual displacement of a cross-over 14' is realised by using the deflection element 17' between the cross-over 14' and the deceleration element 25. The image of the cross-over 14' then moves across the target surface 19 along a linear path. FIG. 3b shows that a real displacement of the cross-over is produced by arranging the deflection element 17' so that it precedes the cross-over 14', the image of the cross-over then moving across the target surface 19 along a linear path.

Figure 4:
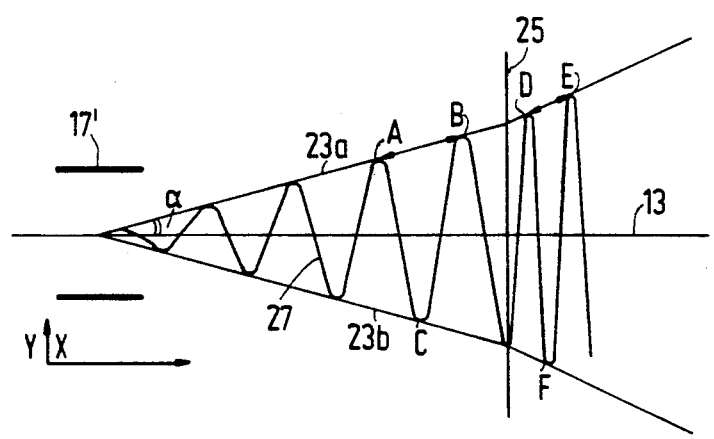
FIG. 4 shows a position of the charged particles along the optical axis when use is made of a deflection in accordance with the invention.

FIG. 4 shows the path 27 on which the ions are present at an instant t when a high-frequency sinusoidal voltage is applied across the electrodes of the deflection element 17'. In the case of a maximum or minimum deflection voltage across the deflection element 17', ions moving without deflection along the optical axis 13 are deflected in the direction of the rays 23a and 23b. In the case of a non-periodic or low-frequency deflection at an instant t, ions are situated on a path which is given by one of the rays 23a or 23b. Due to sinusoidal deflection of the ion beam, the ions which would be present on the path AB at an instant t in the case of non-periodic or low-frequency deflection, are distributed along the path ACB. For an energy of 30 keV, the velocity of phosphor ions amounts to $4.4 \times 10^7$ cms$^{-1}$. At a deflection frequency of 2 MHz, the length of the path AB amounts to 22 cm. After the passage of the deceleration element 25, the velocity component in the direction of the optical axis has been reduced and a path DE amounts to 2.8 cm for an ion energy of 0.5 keV. Due to the sinusoidal deflection of the ion beam, the ions which would be present along the path DE at an instant t in the case of non-periodic or low-frequency deflection, are distributed along the path DFE. It will be evident that deceleration of the ion beam increases the space charge and that this effect can be counteracted by high-frequency deflection of the ion beam. However, the deflection frequency $f_s$ may not become arbitrarily high, because the angle $\alpha$ enclosed by the rays 23a and 23b with respect to the optical axis 13 is proportional to sin $(\pi f_s T)/\pi f_s T$. Therein, T is the transit time of the ions through the deflection element. A first zero value of the angle $\alpha$ occurs when the deflection frequency $f_s$ equals $1/T$. When the deflection element comprises two plate-shaped electrodes having a length of 4 cm, the angle $\alpha$ is still sufficiently large for space charge reduction for phosphor ions with an energy of 30 keV at a deflection frequency of less than 5 MHz.

FIG. 5 shows the substrate 20 across which the ion beam is deflected along the line 30 by the deflection element 17'. Because the ion beam is sinusoidally deflected along the line 30, the implanted concentration will be higher at the ends of the line 30 than in the center where the speed of the ion beam is highest. Due to rotation of the substrate around its center, the lines of equal concentration form concentric circles. When the ion beam is deflected by the deflection element 18' in a direction perpendicular to the line 30, utilizing a modified delta voltage V(t) across the electrodes of the deflection element 18' whose variation is given in FIG. 6 for a period Td, the beam is deflected faster for positions r situated further from the center than for positions on the substrate with a smaller r. V(t) can then be represented as $V(t) = Dt + Bt^3 + Ct^5$. Uniform doping is thus achieved.

FIG. 7a shows the deceleration element 25 which comprises the electrodes 25a, 25b and 18', each of which is provided with a slit 31. The electrodes 25a and 25b carry, for example a potential of −29.5 kV and −6 kV, respectively. As is shown in FIG. 7b, the 18' is subdivided into two mutually insulated parts which are separated by an insulator 33. A modified delta voltage having a frequency of, for example a few hundred Hz and an amplitude of a few hundred volts is applied to the parts of the electrode 18', via a voltage source 39. Because the ion beam has a comparatively low energy at the area of the electrode 18', a deflection of the ion beam can be realised by way of a low voltage.

FIG. 7c is a plan view of the electrodes 25a and 25b. Assuming a curved surface of the electrodes with a radius of curvature R, for a position $Y_0$ with respect to the optical axis 13 the new position Y of the surface 28 of the electrodes 25a and 25b is given by: $Y = (Y_0 + k^2 Y^2 / 8R^2)$. Therein, $k^2$ is the ratio of the potentials of the electrodes 25b and 25a. When the electrodes are curved in this manner, a suitable focusing effect is obtained for the deceleration element in the plane of the drawing, spherical aberration being only slight. In the plane perpendicular to the plane of the drawing of FIG. 7c, focusing can be adapted by modification of the dimension of the electrodes 25a and 25b in the direction of the optical axis 13 as well as by modification of their potential with respect to one another.

It is to be noted that, even though the invention is notably attractive for ion implantation in semiconductor materials, it can be used equally well for methods requiring a low-energetic electron beam.

We claim:

1. A method of irradiating an object with a charged particle beam comprising the steps of
   (a) emitting a charged particle beam from a source,
   (b) periodically deflecting said charged particle beam in a first scanning direction transverse to an optical axis,
   (c) decelerating and focusing the deflected charged particle beam, and thereafter
   (d) periodically deflecting the decelerated charged particle beam onto the object in a second scanning direction transverse to said first scanning direction.

2. A method according to claim 1, wherein the periodic deflection in step (b) is carried out at a frequency of between 1 and 10 MHz.

3. A method according to claim 2, wherein said periodic deflection in step (b) is carried out by applying a sinusoidal voltage.

4. A method according to claim 1 wherein during step (c) said deflected charged particle beam is decelerated to an energy of less than 1 keV.

5. A method according to claim 1, further comprising the step of rotating said object about an axis of rotation having at least one point in common with said optical axis, and wherein during said step (d) the periodic deflection in said second scanning direction is carried out by applying a periodic voltage, said periodic voltage as a function of time being substantially equal to an at least third order polynominal containing exclusively odd exponents.

6. A method according to claim 1, wherein said object is made of a semiconductor substrate, and wherein said charged particle beam is formed as an ion beam.

7. A method according to claim 1, further comprising the step of depositing a layer of semiconductor material upon said semiconductor substrate simultaneously with irradiation of said semiconductor substrate.

8. A charged particle beam system comprising in sequence:
   (a) source means for emitting a charged particle beam,
   (b) first deflection means situated along an optical axis for periodically deflecting said charged particle beam in a first scanning direction across a target surface,
   (c) deceleration means situated along said optical axis for decelerating and focusing the deflected charged particle beam, and
   (d) second deflection means situated along said optical axis for periodically deflecting the decelerated and focussed charged particle beam across said target surface in a second scanning direction transverse to said first direction.

9. A charged particle beam system according to claim 8, wherein said first deflection means operates at a deflection frequency of from 1 to 10 MHz.

10. A charged particle beam system according to claim 8, wherein said deceleration means reduces energy of said charged particle beam to less than 1 keV.

11. A charged beam system according to claim 8, further comprising first focusing means disposed between said first deflection means and said deceleration means for focusing said deflected charged particle beam in a first focusing direction, wherein said deceleration means includes second focusing means for focusing said decelerated charged particle beam in a second focusing direction transverse to said first focusing direction.

12. A charged particle beam system according to claim 11, wherein said first focusing means includes a multi-pole magnetic lens.

13. A charged particle beam system according to claim 8, wherein said deceleration means includes structure having a focusing effect in two mutually perpendicular focusing directions extending perpendicular to said optical axis.

14. A charged particle beam system according to claim 13, wherein said deceleration means includes at least two conductors, each of said two conductors being provided with a curved surface and a slit.

15. A charged particle beam system according to claim 8, wherein said deceleration means includes at least three mutually insulated conductors situated successively along said optical axis, wherein each of said conductors is provided with a slit, and wherein said second deflection means includes one of said conductors, said one conductor being situated furthest from said source means, and said one conductor being subdivided into two mutually insulated parts situated at either side of said optical axis.

16. A charged particle beam system according to claim 8, wherein said second deflection means is connected to a voltage source supplying a periodically varying voltage, said varying voltage as a function of time being substantially equal to an at least third order polynomial containing exclusively odd exponents.

17. A charged particle beam system according to claim 8, wherein said target surface is rotated about an axis of rotation having at least one point in common with said optical axis.

18. A charged particle beam system according to claim 8, wherein said second deflection means is connected to a voltage source providing a voltage having a frequency of a few hundred Hz and an amplitude of a few hundred volts.

* * * * *